(12) United States Patent
Stotz, Jr.

(10) Patent No.: US 9,113,567 B2
(45) Date of Patent: Aug. 18, 2015

(54) DYNAMIC MOUNTING SYSTEM

(71) Applicant: PEM Management, Inc., Wilmington, DE (US)

(72) Inventor: Robert F. Stotz, Jr., Sellersville, PA (US)

(73) Assignee: PEM Management, Inc., Wilmington, DE (US)

( * ) Notice: Subject to any disclaimer, the term of this patent is extended or adjusted under 35 U.S.C. 154(b) by 68 days.

(21) Appl. No.: 13/744,595

(22) Filed: Jan. 18, 2013

(65) Prior Publication Data

US 2013/0189049 A1    Jul. 25, 2013

Related U.S. Application Data

(60) Provisional application No. 61/588,716, filed on Jan. 20, 2012.

(51) Int. Cl.
| | |
|---|---|
| *F16B 5/02* | (2006.01) |
| *H05K 7/12* | (2006.01) |
| *F16B 39/24* | (2006.01) |

(52) U.S. Cl.
CPC .............. *H05K 7/12* (2013.01); *F16B 5/0241* (2013.01); *F16B 5/0266* (2013.01); *F16B 39/24* (2013.01)

(58) Field of Classification Search
CPC ........ F16B 5/0266; F16B 5/0241; H05K 7/12
USPC ........................... 411/999, 544, 552, 107, 353
See application file for complete search history.

(56) References Cited

U.S. PATENT DOCUMENTS

| | | | | |
|---|---|---|---|---|
| 1,177,810 A | * | 4/1916 | Rogness | 411/399 |
| 1,511,445 A | * | 10/1924 | Clarkson | 24/105 |
| 2,201,793 A | * | 5/1940 | Sanborn | 292/251 |
| 2,639,179 A | * | 5/1953 | Phelps | 292/251 |
| 3,465,803 A | * | 9/1969 | Swanstrom et al. | 411/349 |
| 4,523,883 A | | 6/1985 | Peterson et al. | |
| 5,201,625 A | * | 4/1993 | Takenouchi et al. | 411/369 |
| 5,256,019 A | * | 10/1993 | Phillips, II | 411/187 |
| 5,338,139 A | | 8/1994 | Swanstrom | |
| 5,607,313 A | | 3/1997 | Nyman | |
| 5,667,328 A | | 9/1997 | Hofle | |
| 5,673,927 A | | 10/1997 | Vermillion | |
| 6,027,360 A | * | 2/2000 | Jenkins | 439/364 |
| 6,174,173 B1 | | 1/2001 | Fukunaga | |
| 6,213,578 B1 | | 4/2001 | Lagrotta et al. | |
| 6,231,369 B1 | * | 5/2001 | Miyajima et al. | 439/364 |
| 6,262,887 B1 | | 7/2001 | Lee | |

(Continued)

*Primary Examiner* — Flemming Saether
(74) *Attorney, Agent, or Firm* — Ryder, Lu, Mazzeo & Konieczny, LLC; Joseph M. Konieczny, Sr.; Gregory J. Gore

(57) ABSTRACT

A dynamic mounting system couples a first object to a second object by the attachment of a threaded member to a threaded receiving member on the second object to a predetermined depth to cause a biased compression member to exert a predetermined clamping force holding the first object to the second. The first object may be a heat sink in communication with a heat-generating component such as a processor mounted on the second object such as a circuit board. The predetermined depth is reached by advancing the threaded member until its threads pass beyond threads on the receiving member. The predetermined depth of threaded member biases the compression member to maintain a clamping force between the first and second objects within a desired range of temperature.

14 Claims, 2 Drawing Sheets

(56) References Cited

U.S. PATENT DOCUMENTS

| | | |
|---|---|---|
| 6,347,042 B1 | 2/2002 | White |
| 6,392,889 B1 * | 5/2002 | Lee et al. .............. 361/704 |
| 6,485,240 B2 | 11/2002 | Stumpf et al. |
| 6,493,233 B1 | 12/2002 | De Lorenzo et al. |
| 6,752,577 B2 * | 6/2004 | Chen et al. .............. 411/508 |
| 6,979,159 B2 | 12/2005 | Chen |
| 7,333,340 B2 * | 2/2008 | Zhang et al. .............. 361/719 |
| 7,344,345 B2 | 3/2008 | Aukzemas |
| 7,345,247 B2 | 3/2008 | Ireland |
| 7,527,463 B2 | 5/2009 | Wang et al. |
| 7,955,036 B2 * | 6/2011 | Palm .............. 411/155 |
| 2003/0099524 A1 | 5/2003 | Chen |
| 2008/0056844 A1 | 3/2008 | Aukzemas et al. |

\* cited by examiner

DYNAMIC MOUNTING SYSTEM

RELATED APPLICATION

This patent application is a non-provisional of provisional patent application Ser. No. 61/588,716 entitled "Dynamic Mounting System" filed on Jan. 20, 2012, priority from which is hereby claimed.

TECHNICAL FIELD

The present application relates to a dynamic mounting system for providing a predictable clamping force. More specifically, present invention relates to a system for mounting a heat sink to a circuit board.

BACKGROUND OF THE INVENTION

The mounting of one object to another is often required to be dynamic in the sense of permitting dimensional changes or movement between the objects. These changes are often accommodated by a biasing member such as a spring. One particular application requiring a dynamic mounting system is in the field of electronics where heat and vibration need to be accommodated. Within the field of electronics, the mounting of heat sinks, electronic components and circuit boards is of particular importance due to the costly nature of the elements that they attach.

It is known to use captive screws to mount a heat sink to a circuit board with an electronic component such as a microchip held between the heat sink and the circuit board. Because of the nature of electronic components such as microchips, the heat produced by the microchip can be sufficiently extreme to cause expansion of the electronic component and the heat sink. Proposed solutions for providing a dynamic mounting system for heat sinks in the field of electronics include dynamic mounting systems where a near constant clamp load is applied to the microchip through biased attachment to the circuit board. Such a solution is proposed, for example, in U.S. Patent publication 2008/0056844 entitled "Floating Captive Screw." This document teaches limiting the depth of the penetration of an attaching biased screw member that threadably engages a nut in the circuit board. The depth is controlled by the abutment of a flange on the screw when it contacts a top surface of the nut, thus providing a positive stop to further advancement of the screw. A significant problem encountered with this construction is the possibility of damage to the costly electronic components by over tightening of the screw, because it is positively engaged with the nut.

There is therefore a need in the art for a dynamic mounting system for mounting a heat sink to a circuit board in which the attaching element such as a screw cannot be over tightened, thus avoiding costly damage. There is further a need for such a mounting system which is compact and inexpensive to manufacture.

SUMMARY OF THE INVENTION

In order to meet the needs in the art as described above, the apparatus and associated methods of the invention provides a depth determining system for dynamically mounting a first object to a second object by coupling a threaded member to a threaded receiving member on the second object to a predetermined depth to cause a biased compression member to exert a predetermined clamping force holding the first object to the second. In an illustrative example, the first object may be a heat sink in thermal communication with heat-generating components (e.g., processor) on the second object (e.g., circuit board). The predetermined depth may be reached by advancing the threaded member until its threads pass beyond threads on the receiving member. The predetermined depth of the threaded member may bias the compression member to maintain clamping force between the first and second objects within a desired range over a range of temperature.

Various embodiments may provide one or more advantages. For example, certain embodiments may be useful in cooling a microprocessor attached to a circuit board with a heat sink. Some embodiments may allow for thermal expansion and contraction of a first object relative a second object while retaining the first object in contact with the second object at a predetermined clamping force. To improve assembly, some implementations may captivate the screw and spring to the heat sink to prevent components from becoming lost or misplaced, thereby shortening assembly time. Some embodiments may reduce or substantially prevent cracking of solder joints, components, or a first object due to excessive mounting force applied relative a second object. In other embodiments, a biasing spring may permit forgiveness during mechanical testing, such as a drop test to prevent damage to a circuit board and components. In still other embodiments, a substantially stable (e.g., within a specified range) clamping force applied to a circuit board element by a heat sink may prevent overheating and premature failure of the circuit board element.

In some implementations, a tool, for example, may be applied to a screw member when mounting a first object to a second object where the tool includes substantially no control over torque to determine a resultant clamping force between the first object and the second object. In some implementations, an axial length of threads along a screw member and/or a nut along with a biasing compression spring may determine a resultant clamping force. In other embodiments, errors resulting from over-tightening or under-tightening a screw member when assembling objects may be reduced or substantially eliminated. In still further embodiments, a captivated spring applying a consistent clamping force between two objects may be permitted to both compress and expand within a predetermined operational range after connecting the two objects.

The details of various embodiments are set forth in the accompanying drawings and the description below. Other features and advantages will be apparent from the description and drawings. Like reference symbols in the various drawings indicate like or similar elements.

DETAILED DESCRIPTION OF A PREFERRED EMBODIMENT

Figure 1:
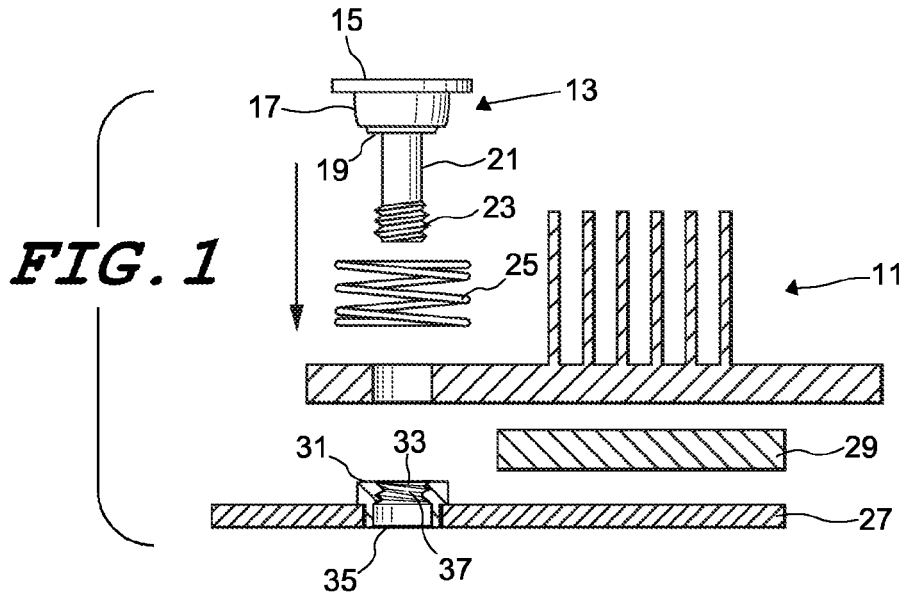
FIG. 1 is an elevation partially-sectioned assembly view that depicts an exemplary mounting system in a disconnected state.
Figure 2:
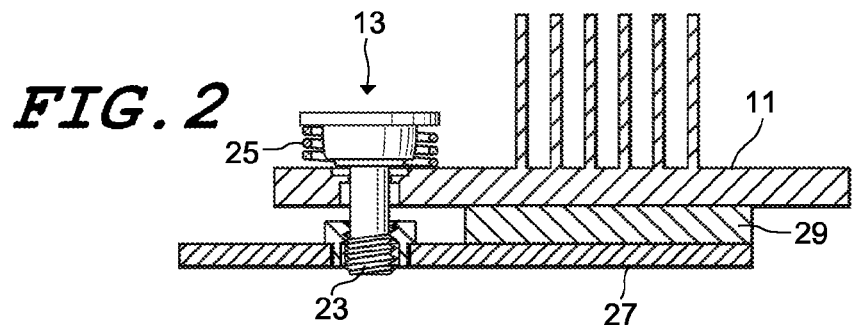
FIG. 2 depicts the same view as in FIG. 1 with the exemplary mounting system of FIG. 1 shown in a connected state.
Figure 3:
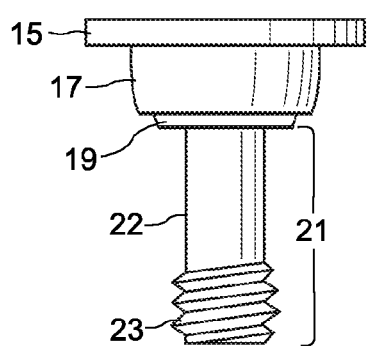
FIG. 3 depicts a side elevation view of an exemplary screw.
Figure 4:
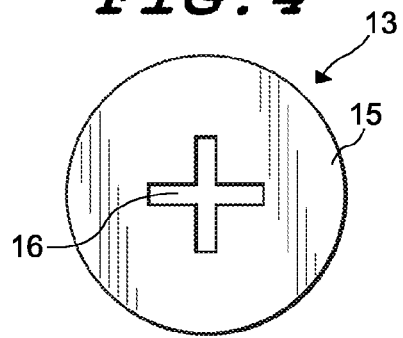
FIG. 4 depicts a top plan view of an exemplary screw head.

To aid understanding, this document is organized as follows. First, FIGS. 1 and 2 illustrate an exemplary assembly process for applying an exemplary heat sink mounting system and the resulting construction using a through-hole nut. FIGS. 3 and 4 depict exemplary screws. Finally, with reference to FIGS. 5-7, an exemplary through-hole nut is shown.

Referring first to FIGS. 3 and 4, these illustrations depict an exemplary screw. In FIG. 3 a screw has a head 15, a shoulder 17, a collar 19, an elongated shank 21, which include a threaded portion 23 and an unthreaded portion 22. The length of the threaded portion and shank may vary with respect to each other than as shown. Additionally, the shoulder and/or collar may be omitted or increased/decreased in relative size depending on the desired retaining structure for the biasing member (e.g., spring) and depending on whether the screw and spring are desired to be captivated to the heat sink prior to attachment to the nut and circuit board. The shoulder diameter can be tapered having interference with the inside diameter of the spring to help with retention during handling and prior to installation into the heat sink. The head diameter is sized to be larger than the diameter of the spring to retain the spring. FIG. 4 depicts a top view of an exemplary screw head of screw 13 having a head 15 and respective tool receiver 16. As described previously, the shape of the head 15 and the type of tool receiver may differ.

Referring now to FIG. 1, the present invention provides direct axial captivation of the screw to the heat sink, thus avoiding the necessity of employing a sleeve to reduce the number of parts required for the assembly. Further detail in reference to this captivation of the heat sink 11 and screw 13 is available in U.S. Pat. No. 5,256,019 assigned to Penn Engineering and Manufacturing Corp. and entitled "Washerless Self-Captivating Screw," the entire contents of which are fully incorporated herein by reference. In accordance with this methodology, material of the heat sink is deformed and pressed inward about the screw shank as the screw is forcibly applied to the heat sink. Of course a sleeve or retainer as is well known in the art may be used to captivate the screw to the heat sink.

FIG. 1 depicts an exemplary mounting system in a disconnected state and FIG. 2 in a connected state. In FIG. 1, the system includes the screw of FIG. 3 13 having a head 15, a shoulder 17, a collar 19, a shank 21, and a threaded portion 23. The head 15 has a larger diameter than the shoulder, collar, or the shank. The shoulder 17 tapers inwardly diametrically to receive a spring 25 in a manner such that the spring 25 is easily received and secured around the shoulder 17 to substantially limit lateral movement, yet permit axial movement with respect to the screw 13. The spring 25 is preferably a compression spring. Also shown is a heat sink 11, such as for example having fins, for dissipating heat, and a circuit board 27 having a circuit element 29 which requires heat dissipation. Attached to the circuit board 27 and aligned with the screw 13 is a through-hole nut 31 having an upper opening 33, a lower opening 35, and internal threads 37 extending from at least one of the upper opening or the lower opening. In FIG. 1, the internal threads of the nut 37 extend from the upper opening 33 part way through the nut 31 in which the axial hole then widens in a counterbore manner to permit free passage of the threaded portion 23 of the screw through the lower opening 35 once the threaded portion 23 is threaded past the internal threads leading from the upper opening. The through-hole nut 31 is attached to the circuit board 27 using a broaching-type fastener structure in this embodiment.

FIG. 2 shows the result of a forcible application of the screw assembly to the heat sink shown in FIG. 1 in which the collar of the screw has deformed the material of the heat sink about the receiving hole forcing some material inwardly about the narrow, unthreaded portion of the screw shank. This slidably captivates the screw/spring assembly to the heat sink. As the screw is turned, once the threaded portion 23 of the screw is advanced past the internal threads of the nut 37 and within the counterbore, upward movement of the screw 13 is restricted by the top of the threaded portion axially abutting the last of the internal threads of the nut. Downward movement of the screw is also opposed by upward bias forces exerted by the spring 25 upon the head of the screw. Thus, the depth of the screw relative the nut and circuit board may be controlled by the axial length of the internal threads within the nut and/or the axial position of the threaded portion along the shank of the screw.

As shown in FIG. 2, the screw 13 has been turned down and threaded past the internal threads of the nut such that when the threaded portion 23 is clear of the internal threads, the spring 25 is not fully compressed to permit its dynamic expansion and contraction and thus permit the safe contraction and expansion of components during respective thermal cycles of circuit element 29. Further, by predetermining the axial position and length of the internal threads of the nut and the axial position and length of the threaded portion of the screw, the resulting compression of the spring and clamp load will be substantially consistent in that the screw cannot be over-tightened. This is a particular advantage of the invention when excessive turning of the screw merely results in the free spinning of the screw thus preventing any possible damage to the screw or the tool receiver by application of excessive torque.

In operation, as the circuit element 29 dissipates heat onto the heat sink and thus the heat sink 11 and circuit element may expand. When the heat sink expands the spring 25 is forced to contract an equal amount which tends to maintain a substantially consistent force and pressure applied to the circuit element by the heat sink. Likewise, when the heat sink contracts due to cooling of the heat sink the spring 25 is forced to expand which tends to maintain a substantially consistent force and pressure applied to the circuit element 29 by the heat sink 11 while the gap between the heat sink and the circuit board can vary.

Figure 5:
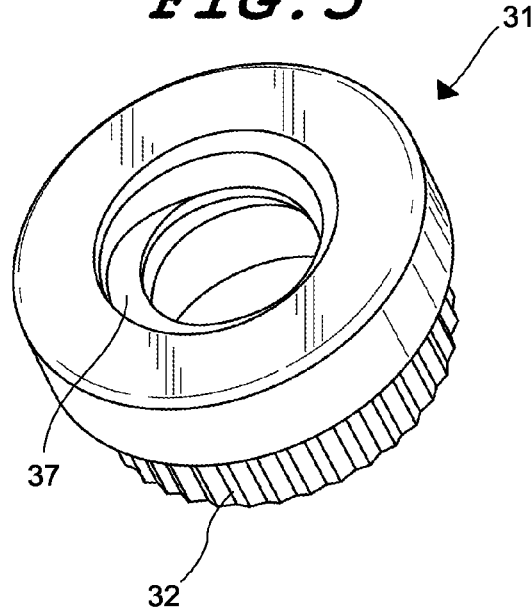
FIG. 5 depicts an upper left perspective view of an exemplary through-hole nut.
Figure 6:
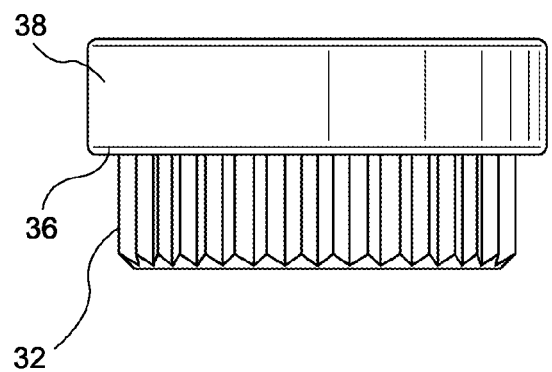
FIG. 6 depicts a side elevation view of the exemplary through-hole nut.
Figure 7:
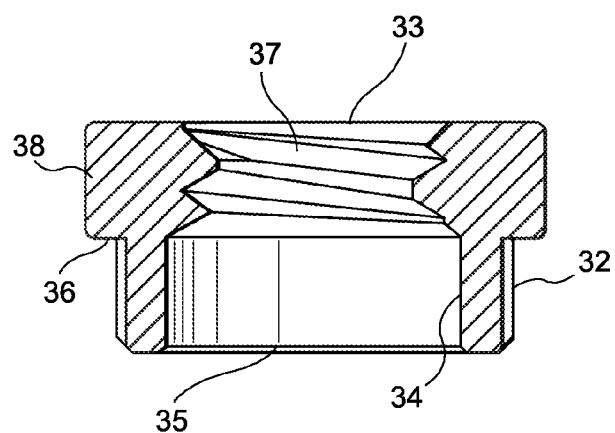
FIG. 7 depicts an elevation cross-sectional view of the exemplary through-hole nut.

FIG. 5 depicts an upper perspective view of an exemplary through-hole nut employed in FIGS. 1 and 2. FIG. 6 depicts a side view of the exemplary through-hole nut, and FIG. 7 depicts a cross-sectional view. The through-hole nut 31 has an upper part and a lower part. The upper part has internal threads 37 and the lower part has broaching-type fastener elements 32 around an exterior and a counterbore 34 within. An upper opening 33 leading to the internal threads 37 through the upper part is of a lesser diameter than a lower opening 35 leading to the counterbore from below. Likewise, the counterbore generally has a greater diameter than the internal threads such that once the threaded part of the screw is threaded beyond the internal threads 37 of the upper part, the threaded portion of the screw may be received freely by the counterbore. A lower surface 36 of a flange 38 of the nut overhangs the lower portion thus making the upper part suitable for surface mounting on both the upper surface and the lower surface of the flange 38. Although a through-hole nut is shown it should be understood that a blind nut properly configured as described above may be used.

Although various embodiments have been described with reference to the figures, other embodiments are possible. For example, the screw may move axially with respect to the heat sink in some embodiments, such as for example with use of the retaining sleeve. In other embodiments the screw and heat sink may move as one component in a direction parallel to the lengthwise axis of the screw away from and toward the circuit board. In each case the spring may exert a force upon the screw and heat sink to ensure that the heat sink maintains contact with the circuit board element to keep the circuit board element cool and prevent overheating. The spring also may enable the screw and heat sink to move to permit the heat sink to expand and contract due to thermal cycles encountered during dissipation of heat from the circuit board element to the heat sink.

The screw may be attached to the nut in a consistent manner due to the depth determining features of the nut and/or screw which may include the depth of the bore within the through-hole nut as well as the position and number of threads upon the screw in the through-hole nut. The screw may be attached at the consistent depth independent of the amount of torque applied to the screw since the screw will only thread within the nut to a certain depth before exhausting the number of available internal threads.

The nut may attach to the circuit board in various manners. In one example, the nut may attach to the top surface of the circuit board, such as for example by having an adhesive or solder layer to affix the nut to the circuit board. In another example, the nut may attach to the bottom surface of the circuit board, such as for example by having an adhesive layer along the top surface of the nut that receives the bottom surface of the circuit board. When attaching to the bottom surface, it is important that the internal threads of the nut align with a hole extending through the circuit board for receiving the threaded part of the screw therethrough. In yet another example, the nut may be secured to the top surface or the bottom surface via one or more fasteners, such as for example screws, bolts, clips, or solder.

The broaching fastener may also be substituted with external threads or other types of fastening elements surrounding or forming the perimeter of the nut and/or screw. The nut may be broached within the circuit board from a top side or from a bottom side. The hole formed within the circuit board and/or heat sink may be milled therein to form a smooth, uniform-surface hole, a threaded hole, or a ridged hole.

The biasing member in some examples may be a spring coupled between a head of the screw member and the first object. The spring may be enabled to bias the heat sink away from the screw. In yet another example, a resilient compound, such as rubber or elastic may be used to assist or enable the screw to be biased with respect to the heat sink. The tightness or compression strength of the spring may be predetermined in a manner that is sufficient to permit the heat sink to expand and contract without putting excessive force upon the circuit board element and without losing contact from the circuit board element by selection of the various components. The degree of compression or force exerted by the spring may also be adjusted as needed.

The heat sink and captivated screw may also attach to various other devices rather than a circuit board for dissipating heat from various other devices or objects, such as for example a motor. In another example, the heat sink and captivated screw may be attached to nut or through nut connected to a resistive heating device, or a device in which heat is generated by friction, wherein it is necessary that heat is dissipated via a heat sink. The heat sink may be of various materials, such as for example aluminum or other metals.

In some examples, the screw and spring may be captivated in objects rather than a heat sink. In other examples, the screw and spring may be utilized to attach a first object to a second object at a predictable and consistent clamping force where the first object is not a heat sink and/or the second object is not a circuit board. In other examples, the screw and spring may not be captivated in the first object or heat sink prior to attachment of the first object to the second object.

Other objects may be attached by use of the dynamic mounting system, for example, a metal shield may be mounted to a circuit board whereby the dynamic mounting system may provide a desired range of clamping force to keep the shield securely attached to the circuit board. The shield may provide, for example, electromagnetic shielding. In another implementation, the dynamic mounting system may maintain a desired range of clamping force to secure a large component (e.g., inductor, transformer, capacitor) to the circuit board over a range of shock, and vibration and/or thermal cycles.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A dynamic mounting system for attaching one object to another, comprising:
   a heat sink and a second object;
   a rotatable screw, having a head at a top end and a shank having an unthreaded portion extending downward from said head and a threaded portion at a bottom-most end of greater diameter than said unthreaded portion;
   an internally threaded nut rigidly affixed to said second object;
   a biasing compression member acting directly between said screw and the heat sink;
   said screw being received by said nut rotatably advanceable by threaded engagement therewith and advanceable to a pre-determined maximum depth, where the screw threads extend beyond and disengage from the nut threads; and
   wherein the elements are selected such that a pre-determined clamp load is applied to components located between the heat sink and the second object.

2. The dynamic mounting system of claim 1 wherein said second object is a circuit board.

3. The device of claim 2 wherein a bottom of the nut is flush with a bottom of the circuit board.

4. The device of claim 2 wherein the nut includes a flange containing a portion of the nut threads and including a lower surface which abuts a top surface of the circuit board.

5. The dynamic mounting system of claim 1 wherein said compression biasing member is a coil spring which surrounds the shank of the screw and acts upon the head of the screw.

6. The dynamic mounting system of claim 5 wherein one end of the spring bears directly upon the heat sink.

7. The dynamic mounting system of claim 1 wherein said screw includes a shoulder, adjacent said head and a collar located immediately below said shoulder.

8. The dynamic mounting system of claim 7 wherein the screw is axially captivated directly to the heat sink by deformation of the heat sink by the collar during forcible application of the screw to the heat sink.

9. The device of claim 8 wherein the shoulder has a length at least equal to the compressed length of the compression member.

10. The device of claim 9 wherein the compression member is a coil spring.

11. The device of claim 10 wherein the threads are of lesser diameter than the shoulder.

12. The dynamic mounting system of claim 1 wherein said nut is a through-hole nut.

13. The dynamic mounting system of claim 1 wherein a bottom portion of the nut includes a counter bore of greater diameter than the threads.

14. The dynamic mounting system of claim 1 wherein said screw passes through aligned apertures in said first and second objects.

\* \* \* \* \*